United States Patent

Lei et al.

(10) Patent No.: US 6,833,195 B1
(45) Date of Patent: Dec. 21, 2004

(54) LOW TEMPERATURE GERMANIUM TRANSFER

(75) Inventors: Ryan Lei, Hillsboro, OR (US);
Mohamad A. Shaheen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/640,783

(22) Filed: Aug. 13, 2003

(51) Int. Cl.[7] .............................................. H01L 21/46
(52) U.S. Cl. ........................ 428/458; 438/473; 438/933; 438/997; 438/474; 438/475; 257/E21.318; 257/E21.321
(58) Field of Search .................................. 438/143, 458, 438/510, 471–477, 933, 977, FOR 291, FOR 485; 257/E21.318, E21.321

(56) References Cited

U.S. PATENT DOCUMENTS

| | | |
|---|---|---|
| 5,603,779 A | 2/1997 | Linn et al. |
| 5,882,987 A | 3/1999 | Srikrishnan |
| 6,140,210 A * | 10/2000 | Aga et al. .................. 438/458 |
| 6,150,239 A * | 11/2000 | Goesele et al. ............ 438/458 |
| 2002/0190269 A1 * | 12/2002 | Atwater et al. ............ 257/184 |

OTHER PUBLICATIONS

Tong et al., Layer Splitting Process in Hydrogen–Implanted Si, Ge, SiC and Diamond Substrates, Appl. Phys. Lett. 70(11), Mar. 17, 1997, pp1390–1392.*
Glinsner, T., et al., "Reversible and Permanent Wafer Bonding for GaAs Processing," GaAs MANTECH, Inc., 2001, 4 pages.
Sze, S.M., et al., "Physics of Semiconductor Devices," John Wiley & Sons, 1981, Appendix H, 4 pages.

* cited by examiner

Primary Examiner—George Fourson
Assistant Examiner—Thanh V Pham
(74) Attorney, Agent, or Firm—Blakely, Sokoloff, Taylor & Zafman LLP

(57) ABSTRACT

A method of bonding a germanium (Ge) wafer to a semiconductor wafer. A Ge wafer having a cleaving plane defined by ion implantation is provided. A surface activation on at least one surface of the Ge wafer is performed. A semiconductor wafer is provided. A surface activation on at least one surface of the semiconductor wafer is performed. The Ge wafer is bonded to the semiconductor wafer to form a bonded wafer pair. A first annealing is performed to the bonded wafer pair. The first annealing occurs at a temperature approximately between 50–100° C. A second annealing is performed to the bonded wafer pair. The second annealing occurs at a temperature approximately between 110–170° C. The second annealing cleaves the Ge wafer at the cleaving plane.

26 Claims, 9 Drawing Sheets

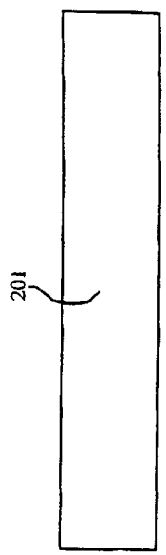
FIG 2C
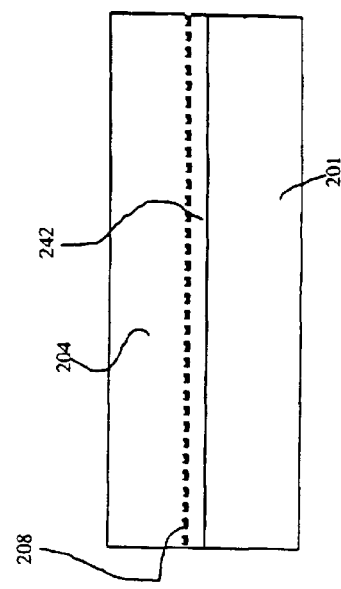
FIG 2D
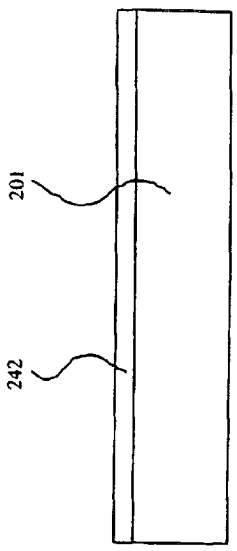
FIG 2F
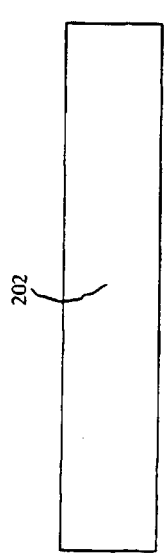
FIG 2A
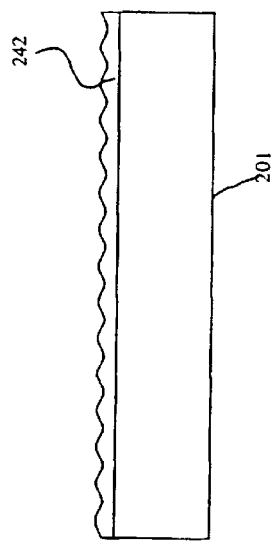
FIG 2B
FIG 2E

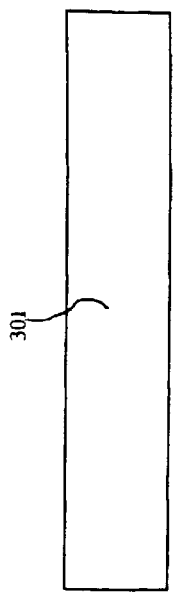
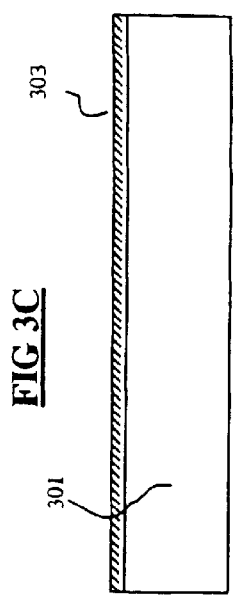
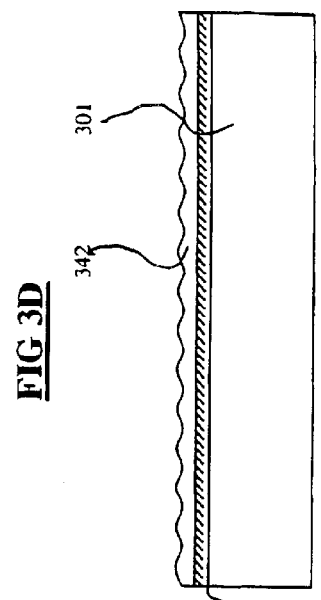
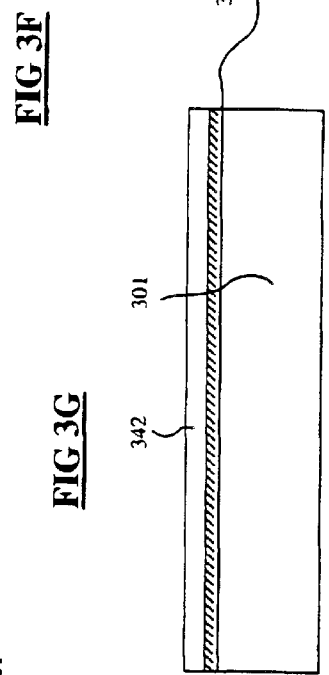
FIG 3C
FIG 3D
FIG 3F
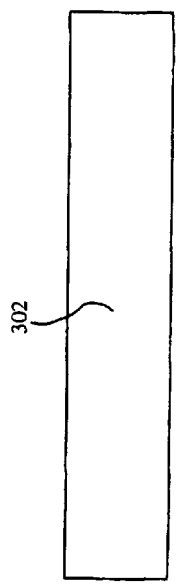
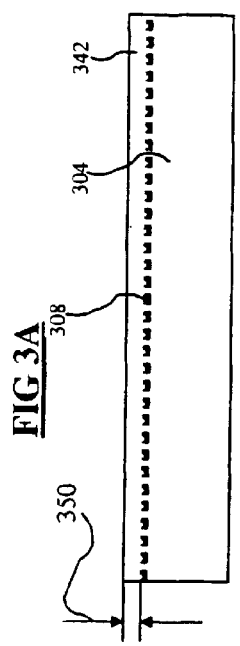
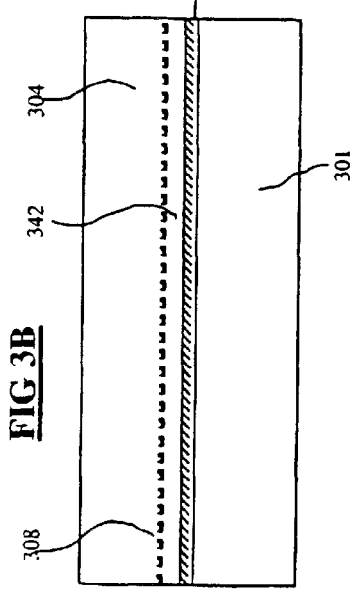
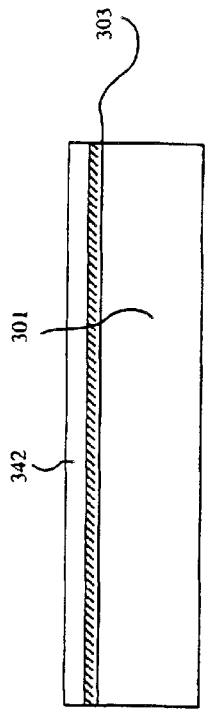
FIG 3A
FIG 3B
FIG 3E
FIG 3G

LOW TEMPERATURE GERMANIUM TRANSFER

BACKGROUND

1. Field

This disclosure pertains to a method of bonding a germanium substrate to a semiconductor substrate such as silicon substrate and a method of transferring a germanium layer to the semiconductor substrate using a low temperature and long duration annealing.

2. Discussion of Related Art

There is an increasing interest in using silicon-germanium (Si—Ge) alloy as a material for microelectronic and optoelectronic device applications. Germanium (Ge) is known to have high carrier mobility (e.g., high hole and electron mobility) and optical absorption as compared to silicon (Si). This is one reason why Ge is useful for devices that require enhanced performance and/or high quantum efficiency. Embodiments of devices that would benefit from the use of a Ge film include metal-oxide-semiconductor (MOS) transistors, optical detectors, and other optoelectronic devices, to name a few.

Forming high quality germanium layers on a substrate is desirable. Ge layers grown on a Si substrate can be used to make high mobility devices. Bulk Si substrates typically have lower electron and hole mobility than Ge substrates. Si typically has an electron mobility of 1500 $cm^2$ N/s and a hole mobility of 450 $cm^2$ N/s whereas Ge has an electron mobility of 3900 $cm^2$ N/s and a hole mobility of 1900 $cm^2$ N/s. Additionally, electronic devices made using bulk Si substrates require high power consumption due to current substrate leakage, especially for high performance devices. The lower mobility and the current substrate leakage problem in using bulk Si for substrate set upper limits on the performance of the electronic devices with regard to material and power dissipation aspects. On the other hand, electronic devices made with Ge require less voltage bias to turn on the devices because of the Ge's high mobility characteristic. In addition, the use of the banded Ge to Si substrate allows the use existing infrastructure for Si substrate.

A Ge substrate can be obtained by transferring a Ge layer onto a semiconductor (e.g., Si) substrate using ion implantation, direct wafer bonding, and cleaving process. The transfer of a Ge layer onto a semiconductor substrate is difficult due to an existence of a large thermal mismatch between Ge and a semiconductor material such as Si. For embodiment, cracking, warping, and/or bowing are often observed when thermal cleaving is used to transfer the Ge onto the Si substrate.

BRIEF DESCRIPTION OF THE DRAWINGS

The disclosure is illustrated by way of embodiment and not by way of limitation in the figures of the accompanying drawings in which like references indicate similar elements. The invention may best be understood by referring to the following description and accompanying drawings that are used to illustrate embodiments of the invention. In the drawings:

FIGS. 2A-F show schematic illustrations of an exemplary method of bonding a Ge wafer to a Si wafer in accordance to the embodiments of the present invention;

FIGS. 3A-G show schematic illustrations of an exemplary method of bonding a Ge wafer to a Si wafer to form germanium-on-insulator (GOI) in accordance to the embodiments of the present invention;

DETAILED DESCRIPTION OF THE PRESENT INVENTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

The embodiments of the present invention direct to methods of bonding a Ge wafer directly to a semiconductor wafer such as silicon (Si) wafer or silicon containing wafer or an oxide surface formed on a semiconductor substrate such as an oxide on Si wafer. The term wafer pair in the disclosure refers to a Ge wafer bonded to a semiconductor wafer. The embodiments also direct to a cleaving method to transfer Ge from the Ge wafer onto the semiconductor wafer.

In one embodiment, ion implantation is performed to a Ge wafer to define a predetermined portion of the Ge wafer to be transferred and a portion to be removed. The Ge wafer is then bonded to a Si wafer to form a bonded wafer pair. A first annealing process is performed to the bonded wafer pair to strengthen the bonding interface of the bonded wafer pair without prematurely cleaving of the Ge wafer. A second annealing process is performed to the bonded wafer pair after the first annealing to cleave off the Ge wafer and leave the predetermined portion of the Ge wafer bonded the Si wafer. After the bonding and annealing, the bonded wafer pair forms a Ge—Si substrate. In another embodiment, each of the Si wafer and the Ge wafer may include an oxide layer formed on a surface. The Si wafer and the Ge wafer are bonded together at the oxide layers. After the bonding and the annealing, the bonded wafer pair forms a Ge-on-insulator (GOI) substrate.

The term "Si wafer" used in this disclosure includes a Si substrate, a Si-containing substrate, a Si substrate having an oxide layer (silicon dioxide), or a silicon-on-insulator (SOI) substrate. The silicon substrate may be monocrystalline, polycrystalline, or bulk silicon. The term "Ge wafer" used in this disclosure includes a Ge substrate made of monocrystalline Ge, polycrystalline Ge, or epitaxially grown Ge.

Figure 1:
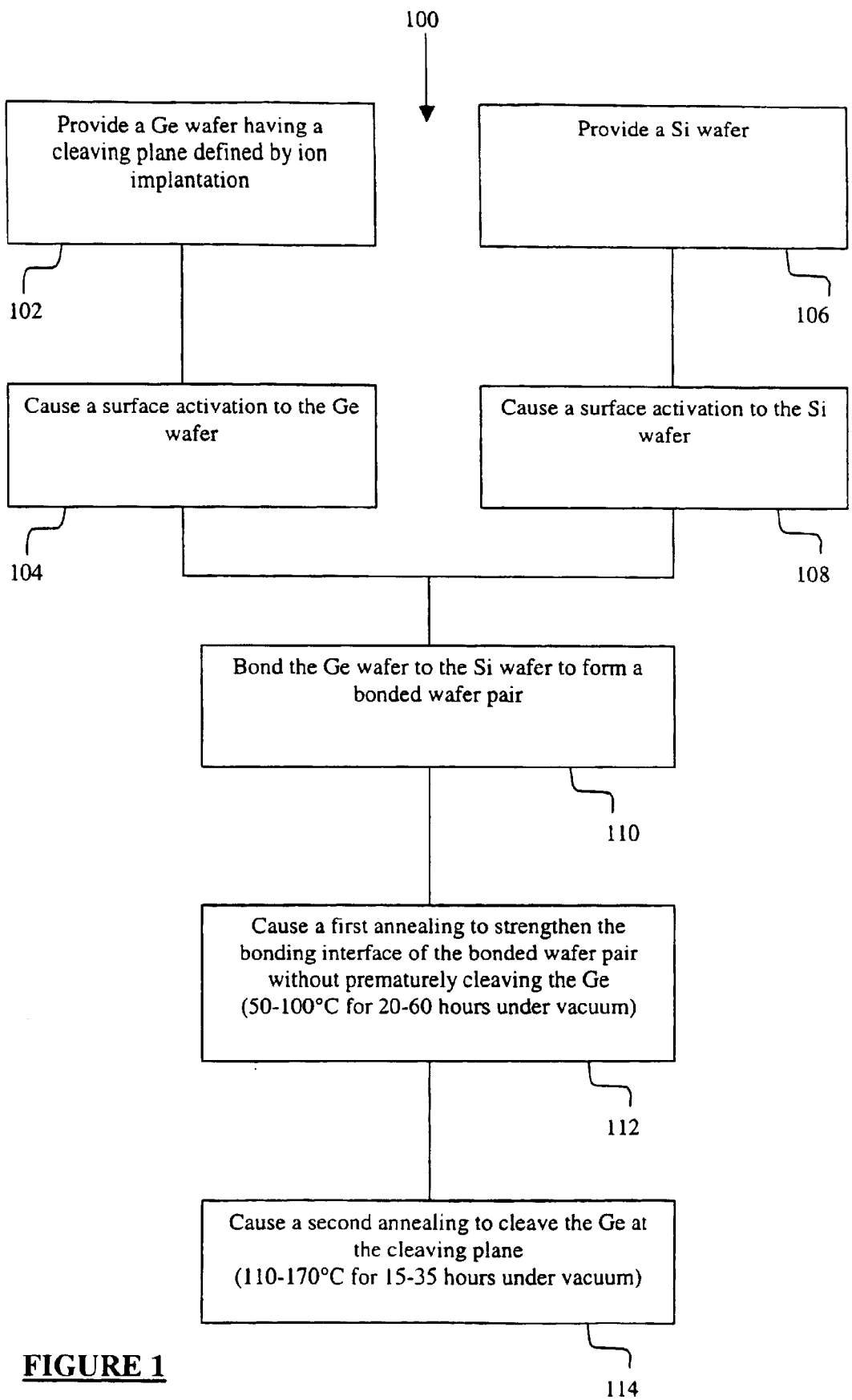
FIG. 1 illustrates an exemplary method of bonding a Ge wafer to a Si wafer in accordance to the embodiments of the present invention.

FIG. 1 illustrates an exemplary method 100 of bonding a Ge wafer to a Si wafer in which a portion of the Ge wafer is to be removed and a portion of the Ge wafer is to be transferred onto the Si wafer to form a Ge—Si wafer. It is to be appreciated that the Si wafer may be replaced by other suitable semiconductor substrate such as Ge and Gallium Arsenide.

As shown in FIG. 1, at box 102, a Ge wafer is provided. The Ge wafer has a cleaving plane, which can be defined by ion implantation. The cleaving plane is the point in the Ge wafer where the Ge portion to be removed and the portion to be transferred are defined. In one embodiment, a conventional ion implantation process is used to implant energetic particles or ions (e.g., hydrogen particles, $H_2^+$ or $H^+$) through the top surface of the Ge wafer to a predetermined depth in the Ge wafer. The implanted ions form a cleaving plane parallel or substantially parallel to the surface of the Ge wafer at the predetermined depth within the Ge wafer. In one embodiment, the ions are implanted to a depth of about 400 nm. A dosage of about $5 \times 10^{16}$ to $5 \times 10^{18}$, or optimally, $1 \times 10^{17}$ is used for the implantation.

At box 104, a surface activation is performed to the Ge wafer. A dry surface activation process should be used to prevent damages to the Ge wafer (for embodiment, water may dissolve Ge). In one embodiment, the surface activation is performed using an oxygen plasma surface activation process. Oxygen plasma surface activation is well known in the art. This process entails bombarding the surface of a substrate with oxygen ions created by a reactive ion etcher or similar device. The surface activation is used to provide the Ge wafer with a clean surface (e.g., substantially particle-free, smooth, and clean surface) for bonding. The oxygen plasma surface activation process etches away a small layer of contaminants (e.g., oxide) on the Ge wafer and provides the Ge wafer with a substantially free-particle surface for bonding. In one embodiment, only the surface of the Ge wafer that is to be bonded to a Si wafer is treated.

At box 106, a Si wafer is provided. As mentioned, the Si wafer can be replaced by other suitable semiconductor substrate. At box 108, a surface activation is performed to the Si wafer. The same oxygen plasma surface activation process used to treat the Ge wafer can be used to treat the surface of the Si wafer. Alternatively, the Si wafer can be surface activated using a wet process such as using a hydrofluoric acid (HF) solution followed by deionized water or IPA, to clean the surface of the Si wafer. The oxygen plasma surface activation process or the wet process cleans and etches away contaminants on the surface of the Si wafer to promote bonding to the surface. In one embodiment, only the surface of the Si wafer that is to be bonded to the Ge wafer is treated.

At box 110, the Ge wafer and the Si wafer are bonded together. A conventional bonding chamber can be used to bond the Ge wafer and the Si wafer together. One embodiment of such conventional wafer-bonding chamber is the EVG 850 Series or the EVG 650 Series wafer bonders made by EV Group, Austria. An appropriate bonding condition for a wafer-bonding chamber is first obtained. The wafer-bonding chamber used for the method 100 must be able to maintain the bonding temperature and bonding pressure. In one embodiment, the bonding temperature is obtained by heating up the wafer-bonding chamber to a desired temperature, (e.g., a temperature ranging from 22° C. to 600° C). In some embodiments, the bonding temperature is room temperature. In another embodiment, a chuck, which is used to hold the wafers, is heated up to the desired temperature for bonding. The bonding pressure is obtained by evacuating the wafer-bonding chamber to a vacuum condition. The pressure of the wafer-bonding chamber can be obtained by using a conventional mechanical pump connected to the wafer-bonding chamber. The pressure of the wafer-bonding chamber is a pressure under which the mutual sticking of the Ge wafer to the Si wafer does not commence and that the Ge wafer and the Si wafer are held with respect to each other. In one embodiment, the pressure of the wafer-bonding chamber is below 1 Torr. In another embodiment, the pressure of the wafer-bonding chamber is about 1 mili Torr. In another embodiment, the pressure of the wafer-bonding chamber is at atmospheric conditions.

The wafer-bonding chamber provides a clean and dry environment for the bonding to occur. Further, as the Ge wafer and the Si wafer are cleaned, they have clean atomically smooth surfaces, especially the surfaces that are to be bonded to each other. The present of small particles (e.g., particles having size larger than about 0.1–0.2 $\mu$m) would interrupt the bonding of the wafers and lead to void and decreasing bonding strength.

In one embodiment, a moisture containing carrier gas such as nitrogen, xenon and helium is introduced into the wafer-bonding chamber at a flow rate of about 10 ml–100 ml per minute to facilitate the bonding.

The bonding may occur with the Si wafer being on the bottom and the Ge wafer being on top. In one embodiment, the Si wafer is placed on the chuck and the Ge wafer is place on the top of the Si wafer for bonding. In another embodiment, the Ge wafer is placed on the chuck and the Si wafer is placed on top of the Ge wafer for bonding.

A local force is applied to the Ge wafer to initiate the bonding of the Ge wafer to the Si wafer. Alternatively, in the embodiment where the Si wafer is on top and the Ge wafer is on the bottom, the local force is applied to the Si wafer to initiate the bonding. In one embodiment, the local force is a force applied to one point on the Ge wafer. In another embodiment, the local force is applied to a region near an edge of the Ge wafer using a Teflon pin conveying a force ranging from 3 Newton to 4000 Newton pressing down on that region. In a preferred embodiment, the local force is about 2000 Newton. The local force initiates the bonding of the Ge wafer to the Si wafer. Once the bonding is initiated, the bonding is propagated to completely bond the Ge wafer to the Si wafer. In one embodiment, the Ge wafer is left on top of the Si wafer for some time (e.g., 30 seconds or more) until the Ge wafer entirely sticks itself to the semiconductor wafer. The bonding time may increase depending on the size or the thickness of the Ge wafer and the Si wafer. The bonding of the Ge wafer to the Si wafer forms a bonded wafer pair.

Continuing with FIG. 1, at box 112, the bonded wafer pair is annealed to strengthen the bonding interface and the bonding of the bonded wafer pair. This annealing process is referred to as "a first annealing." The first annealing process removes and diffuses any moisture trapped at the interface of the Ge wafer and the Si wafer. In one embodiment, the first annealing process takes place in the same wafer-bonding chamber that is used for the bonding. The first annealing process occurs at a temperature that is sufficient to strengthen the bonded wafer pair without causing premature cleaving to the cleaving plane in the Ge wafer. In one embodiment, the first annealing process occurs at an annealing temperature between about 50–100° C. for about 20–60 hours. The first annealing occurs under a vacuum condition and in one embodiment, under a pressure ranging between about 100 and 400 Torr. Optimally, the first annealing occurs at the lowest temperature and longest time possible to provide the bonded wafer pair with a strong interface without prematurely cleaving or sometimes, cracking the bonded wafer pair. In one embodiment, the bonded wafer pair is annealed in the presence of a carrier gas such as nitrogen and at a temperature of about 100° C. for 20 hours.

In one embodiment, the annealing temperature is obtained by ramping up the temperature while the bonded wafer pair resides in the chamber. In this embodiment, the ramping rate for the annealing temperature is about 1° C./minute. In one embodiment, the temperature is ramped up from a room temperature (e.g., 23° C.) to an annealing temperature of 100° C., which takes about 77 minutes. The chamber is maintained or held at 100° C. for 20 hours for the first annealing of the bonded wafer pair. The bonded wafer pair is then cooled down while the chamber is ramped down from the annealing temperature to room temperature. It is optimal to allow the chamber to cool down at a rate of 1° C./minute. Alternatively, the chamber may be cooled at a rate of 220 C./minute. The small rate of ramping up and ramping down the temperature for the first annealing prevents cracking the bonded wafer pair while allowing slow and strong strengthening of the interface of the bonded wafer pair.

Continuing with FIG. 1, at box 114, the bonded wafer pair is annealed at a temperature that will allow the cleaving of the Ge at the cleaving plane. The cleaving removed the portion of the Ge wafer that is to be removed to allow the remaining portion of the Ge wafer to transfer onto the Si wafer. Cleaving occurs at the cleaving plane created in the Ge wafer using ion implantation as previously described. This annealing process is referred to as "a second annealing." The second annealing occurs at a higher temperature than the first annealing. In one embodiment, the second annealing occurs at a temperature between about 110–170° C. The second annealing process causes the ions to coalesce to form a plurality of cracks parallel to the surface of the Ge wafer.

The second annealing process may take place in the same chamber that is used for the first annealing or the wafer-bonding chamber. In one embodiment, the second annealing process occurs at an annealing temperature between about 110–170° C. for about 15–35 hours. The second annealing also occurs under a vacuum condition and in one embodiment, under a pressure ranging between about 100 and 400 Torr. In another embodiment, the bonded wafer pair is annealed in the presence of a carrier gas such as nitrogen and at a temperature of about 150° C. for 20 hours under vacuum.

In one embodiment, the annealing temperature for the second annealing is obtained by ramping up the temperature while the bonded wafer pair resides in the chamber. In this embodiment, the ramping rate for the annealing temperature is about 1° C./minute. In one embodiment, the temperature is ramped up from the annealing temperature for the first annealing (e.g., 100° C.) to an annealing temperature for the second annealing of about 150° C., which takes about 50 minutes. Alternatively, the temperature is ramped up from a room temperature (e.g., 23° C.) to an annealing temperature for the second annealing of about 150° C., which takes about 127 minutes. In either embodiment, the chamber is maintained or held at the annealing temperature (e.g., 150° C.) for the amount of time required to cleave the Ge wafer (e.g., 20 hours). The cleaved Ge is removed and the remaining bonded wafer pair is Ge—Si in which the Ge is thinner than the original Ge wafer. The cleaved Ge portion can be reused as needed. The bonded wafer pair is then cooled down while the chamber is ramped down from the annealing temperature to room temperature. It is optimal to allow the chamber to cool down at a rate of 1° C./minute. Alternatively, the chamber may be cooled at a rate of 2° C./minute. The small rate of ramping up and ramping down the temperature for the second annealing prevents cracking the bonded wafer pair while cleaving to propagate along the entire surface of the Ge wafer.

In one embodiment, the second annealing follows immediately after the first annealing. The second annealing needs not follow immediately after the first annealing.

It is advantageous to have the portion of the Ge wafer to be removed by thermally cleaving as described above (e.g., through annealing). Conventional methods have used cleaving methods such as applying a nitrogen jet to a point along the cleaving plane created in the Ge wafer to initiate the cleaving which propagates along the entire surface. In addition, methods such as grinding have also been used to remove Ge wafer. For more superior and efficient devices, the Ge wafer transferred onto the Si wafer should be as thin as possible. Removing a portion of the Ge wafer by jetting, for embodiment, does not allow much control to the thickness of the portion of the Ge wafer to be removed and the portion to be transferred onto the Si wafer. Grinding away the Ge wafer increases the cost of making Ge wafer bonded to a substrate since the portion grinded away will be wasted and cannot be re-used as in the embodiments discussed.

After cleaving, the bonded wafer pair may have a rough surface on the Ge side. The Ge side of the bonded wafer pair may be polished (and if needed, further thinned) using a chemical mechanical polishing (CMP) wet chemical treatment, or wet/dry etching method well known in the art. In one embodiment, a CMP tool illustrated in FIG. 5 is used to polish and/or to repair any surface damage and/or roughness in the Ge wafer.

In one embodiment, the Ge wafer is implanted (via the ion implantation) such that once the Ge portion to be removed is cleaved the remaining Ge portion has a thickness ranging approximately from 100–500 Å. Alternatively, the remaining Ge portion may be thicker than 100–500 Å and can be thinned down to a thickness ranging approximately from 100–500 Å using a CMP process or other suitable methods.

Figure 5:
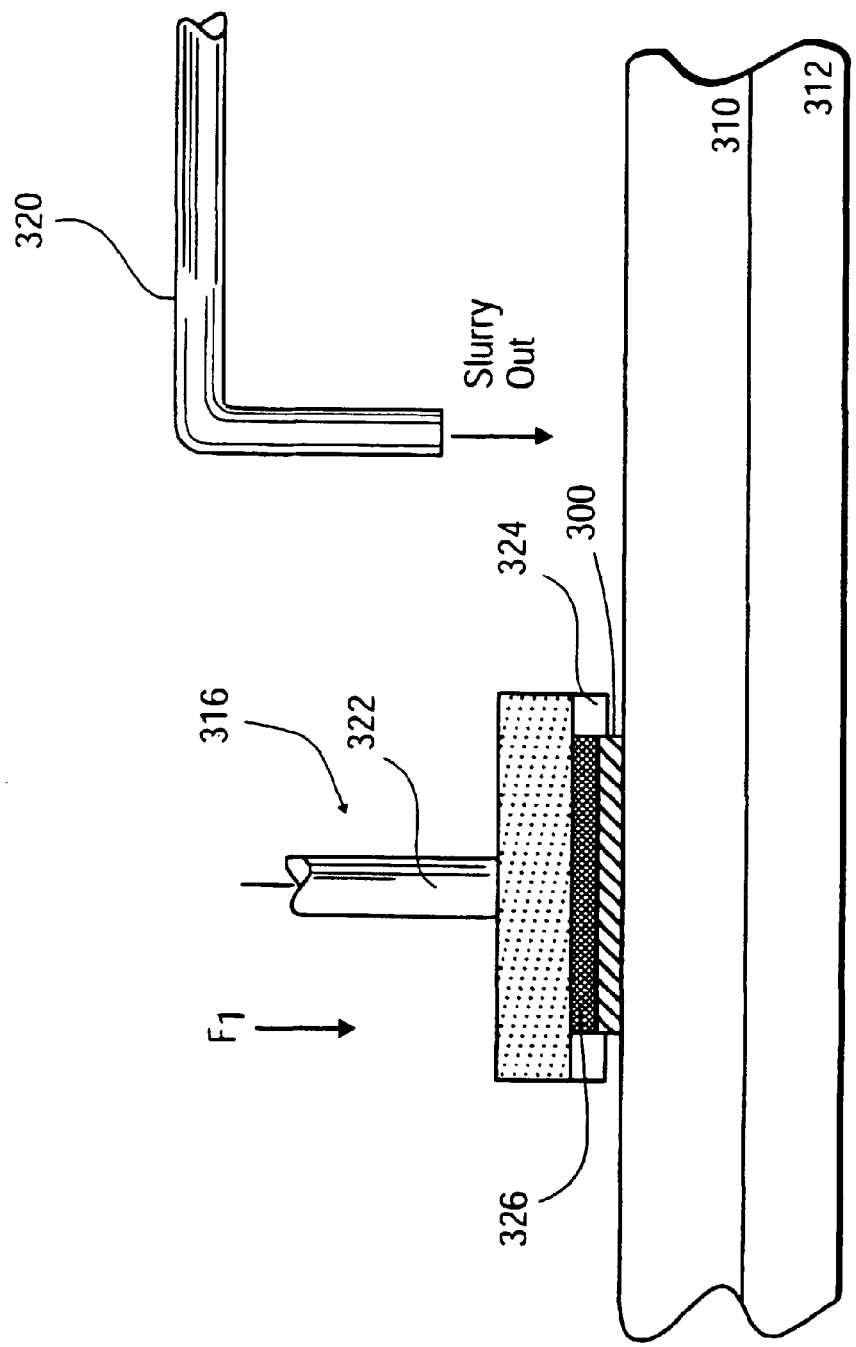
FIG. 5 illustrates an exemplary CMP tool that can be used to smooth the surface of Ge wafer after the bonding of the Ge wafer to the Si wafer.

FIG. 5 illustrates an exemplary method of polishing the Ge wafer portion of the bonded wafer pair. It is to be appreciated that other polishing method can be used to treat the bonded wafer pair. As shown in FIG. 3, a wafer pair 300 indicates the Ge wafer bonded to a Si wafer using methods previously described. In one embodiment, the wafer pair 300 is placed face down on a polishing pad 310 attached to a rotatable table 312. The Ge wafer of the wafer pair 300 to be thinned is placed in direct contact with polishing pad 310. A carrier 316 is used to forcibly press the wafer pair 300 down against the polishing pad 310 during polishing. A slurry is deposited onto the polishing pad 310 from a nozzle 320 during polishing. Slurry chemically passivates or oxidizes the Ge wafer being polished and then abrasively removes or polishes off the passivated or oxidized surface. The slurry may be formulated to remove only thin layer of the Ge wafer as it polishes the surface of the Ge wafer. Alternatively, the slurry may be formulated to remove more of the Ge wafer as in the case where the Ge wafer needs to be thinned down. The chemically reactive slurry facilitates the removal of the Ge wafer as the pad 310 and the wafer pair 300 are rotated relative to one another under a polishing pressure $F_1$ applied by the carrier 316. Polishing is continued in this manner until the desired smoothness and/or thickness is achieved.

The slurry can be a conventional slurry used to polish a semiconductor wafer. The slurry comprises an oxidizing agent and an abrasive. The oxidizing agent oxidizes the Ge wafer and the abrasive physically removes the oxidized Ge wafer. Oxidizing agents including, but not limited to, potassium ferricyanide, potassium dichromate, potassium iodate, potassium bromate, and vanadium trioxide. An abrasive, such as silica, alumina, or ceria, is provided in the slurry to physically or mechanically strip the passivated surface of the Ge being polished. Silica is the preferred abrasive in the present invention because it can be used without scratching the surface of the Ge wafer. The abrasive can be a colloidal silica is manufactured by Cabot, Inc. and sold under the trade name Semi-Sperse TM-25. (Semi-Sperse TM-25 comprises approximately 25% by weight silica, a small amount of KOH and deionized water). An alternative colloidal Silica is Cab-O-Sperse® TM which is also manufactured by Cabot, Inc. (Cab-O-Sperse® TM. comprises approximately 15% weight percent silica and the remainder deionized water.)

Another slurry that can be used is Levasil made by Bayer Electronic Chemical, which has a chemical name of Colloidal silicic acid in aqueous solution (amorphous silicon dioxide in water) otherwise known as silica slurry. Bayer Electronic Chemical is a division of Bayer Corporation located in Pittsburgh, Pa.

The polishing pad 310 can be formed of a variety of different materials. For embodiment, the polishing pad 310 can be a hard pad such as the IC-60 pad manufactured by Rodel Corporation. Additionally, the polishing pad 310 can be a relatively soft pad such as the Polytech Supreme pad also manufactured by Rodel Corp. A soft polishing pad is thought to provide improved polish removal rates and improved uniformity. What is important, however, is for the polishing pad 310 to adequately and uniformly deliver the slurry across the entire Ge wafer and polishing pad interface. A plurality of performed grooves (not shown) can be added to the polishing pad 310 to help transport slurry about the Ge wafer and polishing pad interface. Additionally, the slurry needs not be simply deposited onto the polishing pad 310 from the nozzle 320, as shown in FIG. 5, but rather can be pumped through the polishing pad directly to the wafer pad interface as well known in the field.

A carrier 316 can be used to forcibly press and rotate the wafer pair 300 against the polishing pad 310 during polishing. A shaft 322 is used to apply a downward force $F_1$ (between 2–12 psi) and to rotate the wafer pair 300 during polishing. An ordinary retaining ring 324 can be used to prevent wafer pair 300 from slipping laterally during polishing. An insert pad 326 is preferably used to cushion wafer pair 300 from the carrier 316. Wet surface tension or vacuum pressure can be used to hold the wafer pair 300 in place. The above discussion with respect to FIG. 5 illustrates only an exemplar embodiment of using CMP. Optimization and modification can be made without deviating from the scope of the embodiments of the present invention.

Another exemplary method of thinning down the Ge wafer that is bonded to the Si wafer is wet chemical etching. In one embodiment, a commercial silicon etchant is used to etch the wafer pair. An embodiment of such an etchant is CP-4A which is a commercial name for a solution containing $CO_2H$, hydrofluoric acid (HF), nitric acid ($HNO_3$) and glacial acetic acid ($CH_3CO_2H$). The CP-4A etchant has typical concentration of $3HF: 5HNO_3: 3CH_3CO_2H$. The etchant can also be made by mixing 3 parts of a 49% HF (v/v) with 5 parts 70% $HNO_3$ (v/v) and with 3 parts 100% $CH_3CO_2H$ (v/v) together. The etchant is poured into a container into which the wafer pair is deposited. The wafer pair is left inside the container containing the etchant for a predetermined amount of time, e.g., 5 to 10 minutes to obtain the desired thickness for the Ge wafer. Note that the Si wafer will also be etched. In one embodiment, the etching rate is about 10 to 15 $\mu$m per minute. The rate of etching can be optimized by varying the concentration of the elements of the etchant. In other embodiments, the duration is varied to obtain different thickness for the Ge wafer. Since the Si wafer will also be etched in this process, the thickness of the Si wafer may be chosen accordingly to account for the etching of the wafer during the thinning process of the Ge wafer.

Figure 4:
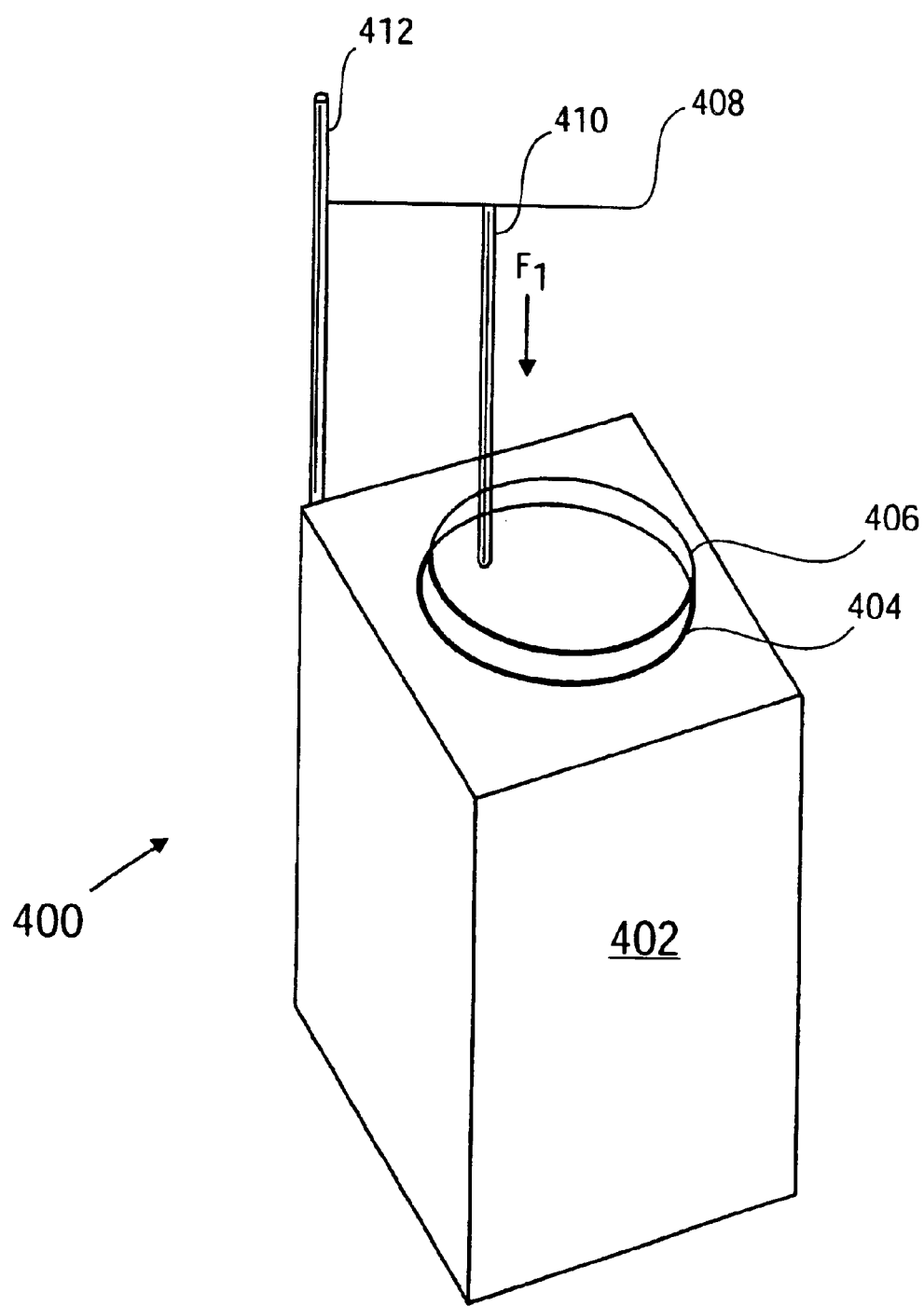
FIG. 4 illustrates an exemplary wafer bonding tool that can be used to bond a Ge wafer to a Si wafer.

FIG. 4 illustrates an exemplary wafer-bonding chamber 400 that can be used for the method 100 discussed in FIG. 1. The wafer-bonding chamber 400 can be a conventional wafer-bonding chamber (e.g., EVG 850 Series or the EVG 650 Series wafer bonders made by EV Group). More specifically, the wafer-bonding chamber 400 includes a chuck 402, a fixture 412, and pin handle 408, and a pin (Teflon pin) 410. A Si wafer 404 is placed on the chuck 402 for bonding. The Si wafer 404 is similar to the Si wafer used in the method 100 previously described. A Ge wafer 406 is placed on top the Si wafer 404 such that there is a slight tiny air gap between the Ge wafer 406 and the Si wafer 404 until the bonding is initiated. The Ge wafer 406 is similar to the Ge wafer used in the method 100 previously described. Alternatively, the Ge wafer 406 is first placed on the chuck 402. The Si wafer is then placed on top of the Ge wafer. The bonding is initiated by the pin 410, which is attached to the pin handle 408. The pin 410 applies a local force $F_1$ onto a region on the Ge wafer to initiate the bonding. Alternatively, the pin 410 applies the local force $F_1$ onto a region on the Si wafer in the embodiment that the Ge wafer is on the bottom of the Si wafer to initiate the bonding. In one embodiment, the region where the local force $F_1$ is applied to is located near the edge of the wafers. In a preferred embodiment, the pin 410 is able to apply a local force ranging from about 3 Newton to about 4000 Newton. The chamber 400 is able to maintain a bonding temperature ranging from about 22° C. to 500° C. The chamber 400 is also able to maintain a bonding pressure at below atmospheric pressure, and in some cases, as low as a pressure less than 1 Torr or as low as 1 mili Torr.

FIGS. 2A-2F illustrate an exemplary embodiment where a Ge wafer 202 is bonded to a Si wafer 201. In FIG. 2A, the Ge wafer 202 is provided. The Ge wafer 202 is subjected to ion implantation 206 resulting in the Ge wafer 202 with a cleaving plane 208 as illustrated in FIG. 2B. The ion implantation 206 is controlled so that ions are implanted to a depth 250 into the Ge wafer 202. The implanted ions create the cleaving plane 208. The cleaving plane 208 defines a Ge portion 204 to be removed and a Ge portion 242 to be transferred onto the Si wafer 201. In one embodiment, the ions are implanted into the Ge wafer 202 through the Ge portion 242 to be transferred.

In FIG. 2C, the Si wafer 201 is provided. The Si wafer 201 is then bonded to the Ge wafer 202 as illustrated in FIG. 2D. Either the Si wafer 201 or the Ge wafer 202 can be on top or bottom during the bonding. As illustrated in FIG. 2D, the Ge wafer 202 is placed on top of the Si wafer 201 for bonding. Prior to bonding, the surface of each of the Ge wafer 202 and the Si wafer 201 is activated as previously described to allow optimal bonding of the two wafers.

After the Si wafer 201 and the Ge wafer 202 are bonded to each other, the bonded wafer pair is anneal twice. A first annealing is done at an annealing temperature approximately between 50–100° C. for about 20–60 hours under vacuum. The first annealing is done to strengthen the bonding interface of the bonded wafer pair but not to cause premature cleaving of the Ge portion 204 and/or cracking in the Ge wafer 202. The first annealing is done with the annealing temperature ramping up to the approximately between 50–100° C. at a rate of 1° C./minute. After the first annealing, the bonded wafer pair may be allowed to cool with the temperature being ramped down at a rate of 1° C./minute, or alternatively, 2° C./minute. A second annealing is done at an annealing temperature between 110–170° C. for about 15–35 hours under vacuum. The second annealing is done to thermally cleave the portion 204 off the bonded wafer pair. FIG. 2E illustrates the bonded wafer pair with the Ge portion 204 is cleaved and removed. The surface of the Ge portion 242 remained on the Si wafer 201 may be rough and/or damaged as illustrated in FIG. 2E. A smoothing process such as CMP or wet etching previously described may be used to smooth and/or thin the surface of the Ge portion 242 to provide the final bonded wafer pair structure shown in FIG. 2F. The bonded wafer pair is referred to as a Ge—Si substrate, which can be used to fabricate various semiconductor devices, e.g., a transistor.

FIGS. 3A-3G illustrate another exemplary embodiment where a Ge wafer 302 is bonded to a Si wafer 301. In FIG. 3A, the Ge wafer 302 is provided. The Ge wafer 302 is subjected to ion implantation to create a cleaving plane 308 in the Ge wafer 302 as illustrated in FIG. 3B. The ion implantation is controlled so that ions are implanted to a depth 350 into the Ge wafer 302. The cleaving plane 308 defines a Ge portion 304 to be removed and a Ge portion 342 to be transferred onto the Si wafer 301. In one embodiment, ions are implanted into the Ge wafer 302 through the Ge portion 342 to be transferred.

In FIG. 3C, the Si wafer 301 is provided. In FIG. 3D, an oxide layer 303 (e.g., silicon dioxide) is formed on a surface of the Si wafer 301 that is to be the bonding surface. The Si wafer 301 is bonded to the Ge wafer 303 as illustrated in FIG. 3E. The oxide layer 303 is placed adjacent to the Ge portion 342 and the Ge wafer 302 and the Si wafer 301 are bonded to each other. Either the Si wafer 301 or the Ge wafer 302 can be on top or bottom during the bonding. As illustrated in FIG. 3E, the Ge wafer 302 is placed on top of the Si wafer 301 for bonding. Prior to bonding, the surface of each of the oxide layer 303 and the Ge portion 342 is activated as previously described to allow optimal bonding of the two wafers. In one embodiment, an oxygen plasma surface activation is used to clean both bonding surfaces for optimal bonding strength.

After the Si wafer 301 and the Ge wafer 302 are bonded to each other, the bonded wafer pair is anneal twice. A first annealing is done at an annealing temperature approximately between 50–100° C. for about 30–60 hours under vacuum. The first annealing is done to strengthen the bonding interface of the bonded wafer pair but not to cause premature cleaving of the Ge portion 304 and/or cracking in the Ge wafer 302. The first annealing is done with the annealing temperature ramping up to the approximately between 50–100° C. at a rate of 1° C./minute. After the first annealing, the bonded wafer pair may be allowed to cool with the temperature being ramped down at a rate of 1° C./minute, or alternatively, 3° C./minute. A second annealing is done at an annealing temperature between 110–170° C. for about 15–35 hours under vacuum. The second annealing is done to thermally cleave the portion 304 off the bonded wafer pair.

FIG. 3F illustrates the bonded wafer pair with the Ge portion 304 is cleaved and removed. The Ge portion 342 remains bonded to the Si wafer 301 through the oxide layer 303. The surface of the Ge portion 342 may be rough and/or damaged as illustrated in FIG. 3F. A smoothing process such as CMP or wet etching previously described may be used to smooth and/or thin the surface of the Ge portion 342 to provide the final bonded wafer pair structure shown in FIG. 3G.

The bonded wafer pair formed as shown in FIGS. 3A-3G forms a germanium-on-insulator (GOI) substrate. The oxide layer 303 forms a buried oxide layer (BOX) for the GOI. The GOI substrate can be used to fabricate various semiconductor devices, e.g., a transistor.

Figure 6A:
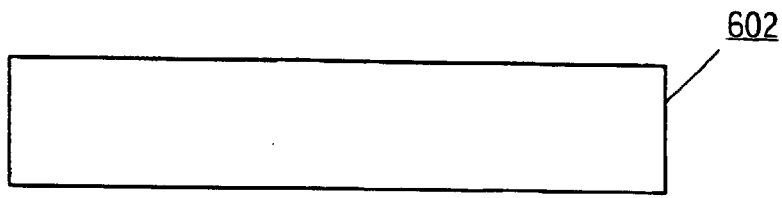
FIGS. 6A to 6G illustrate an exemplary semiconductor device (e.g., a transistor) that can be fabricated in a Ge substrate formed in accordance to some of the embodiments of the present invention.
Figure 6B:
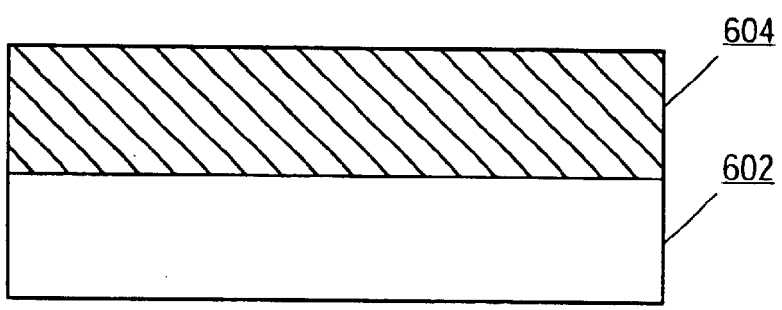
Figure 6C:
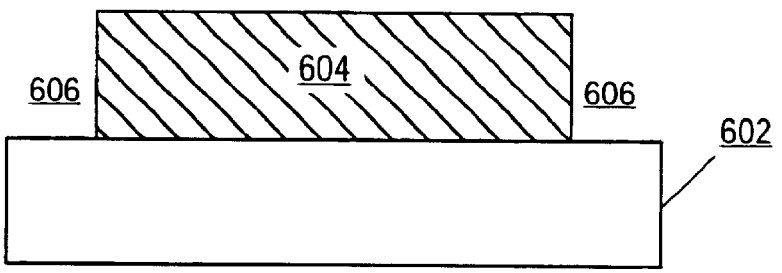
Figure 6D:
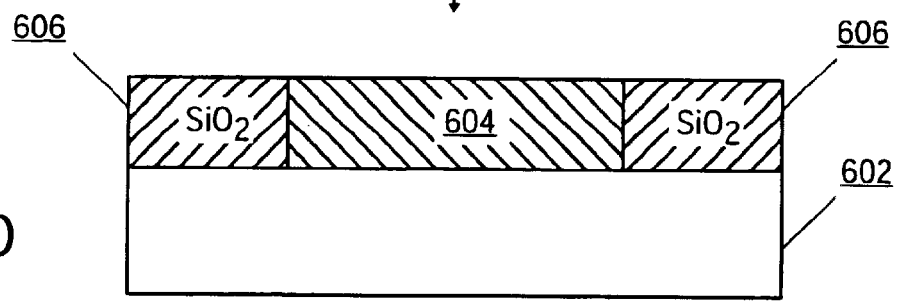

FIGS. 6A to 6G illustrate an exemplary process of making a Ge body transistor. The Ge wafer is bonded to the Si wafer using methods previously described. In FIGS. 6A to 6B, a Ge wafer 604 is bonded to a silicon wafer 602. In one embodiment, the silicon wafer 602 is doped with suitable dopants for a transistor. In one embodiment, the Si wafer 602 is a monocrystalline silicon and the Ge wafer 604 is a monocrystalline Ge. In one embodiment, the Ge wafer may be moderately doped (e.g., $1 \times 10^{16}$ per $cm^3$ to $1 \times 10^{15}$ per $cm^3$). In one embodiment, the doping concentration is chosen to properly target the transistor threshold voltage. Shallow trench isolations 606 may be formed into the Ge wafer 604 using conventional methods (e.g., etching) to insulate one device from another. The shallow trench isolations 606 can be formed by first etching regions for the shallow trench isolation 606 into the Ge wafer 604 and then filling the regions with an insulator, typically $SiO_2$ as shown in FIG. 6D. The etched region for the shallow trench isolation 606 can be of any suitable dept and as shown is FIG. 6C, sufficiently deep to remove most or all of the Ge from the shallow trench isolator 606. In one embodiment, a conventional chemical mechanical polishing method may be used to polish the $SiO_2$ to ensure sufficient planarity.

Figure 6E:
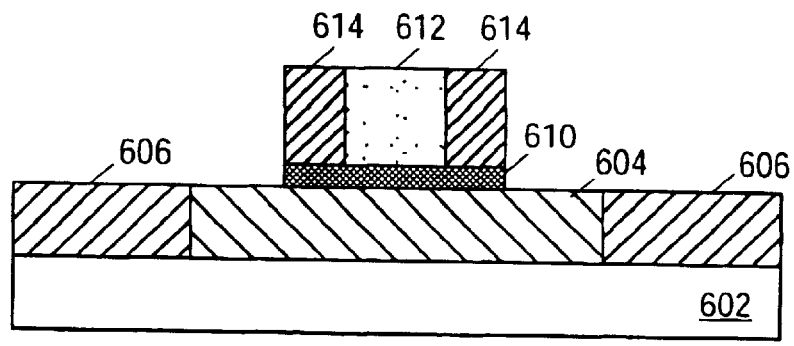

In FIG. 6E, a gate dielectric 610, a gate electrode 612, and spacers 614 can be formed on the top surface of the Ge wafer 604 using conventional methods (e.g., conventional film deposition and patterning). In one embodiment, the gate dielectric 610 can be deposited by a blanket deposition of a high-k oxide film. The deposition of the gate dielectric 610 is necessary since germanium does not form a stable oxide. In one embodiment, the gate dielectric 610 is made out of a high-k dielectric material such as zirconium oxide ($ZrO_2$). The gate electrode 612 can also be formed by a blanket deposition. The gate electrode 612 can be made out of a metal containing material, such as titanium nitride or tungsten, for a metal gate. The gate electrode 612 can be appropriately doped poly-Silicon such as for a conventional gate. In one embodiment, after the gate dielectric 610 and the gate electrode 612 are blanket deposited over the Ge wafer 604, they are patterned to define the dimension of the gate dielectric 610 and the gate electrode 612. The gate dielectric 610 and the gate electrode 612 are patterned in a single process. The spacers 614, typically comprise of a combination of $SiO_2$ and $Si_3N_4$, are also formed, first, by blanket deposition. And then, the spacers 614 are defined using conventional spacer etching method.

Figure 6F:
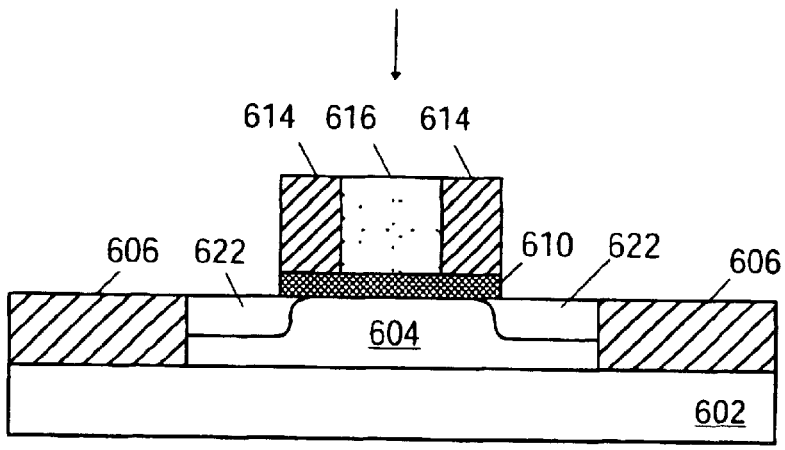

In FIG. 6F, source and drain regions 622 are formed in the Ge wafer 604 using conventional methods. The source and drain regions 622 may be heavily doped with a dopant concentration of $1 \times 10^{20}$ per $cm^3$.

Figure 6G:
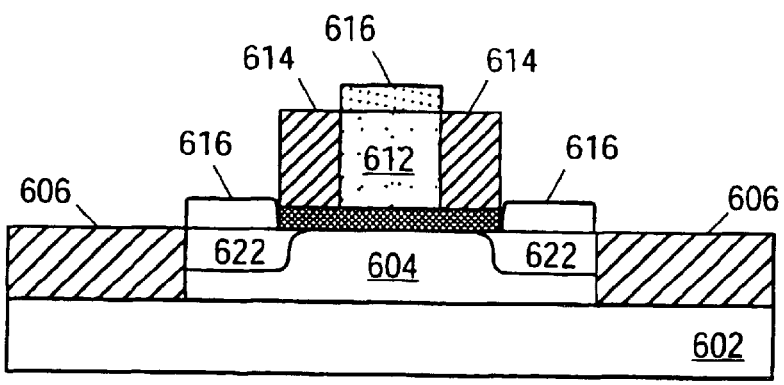

In FIG. 6G, a nickel-germanium (NiGe) layer 616 is formed on the Ge wafer 604 over the regions that are not covered with the gate dielectric 610 and the spacers 614. In one embodiment, the NiGe is formed by a low-temperature annealing method using an annealing temperature of about 400° C. to 600° C. Depositing a metal (e.g., nickel) that reacts with the material in the transistor body can substantially lower the resistivity of the source and drain contacts. Conventional methods are used to anneal the substrate 602. The annealing temperature for the transistor 600 comprising the Ge wafer 604 is kept low, 400° C. to 600° C., to prevent the refractory metal from agglomerating, which tends to increase the resistivity of the source and drains 605 and degrade the performance of the transistor 600. The refractory metal used to anneal the transistor 600 comprising the Ge wafer 604 is preferably nickel (Ni). Alternatively, another metal with low resistivity can be used.

Those skilled in the art will recognize that the features mentioned in FIGS. 6A to 6G and other features may be used or may be left out, depending upon the particular function of the device. For embodiment, after the formation of the NiGe, the transistor 600 is subjected to convention process of forming interlayer dielectric deposition, contact patterning, metalization, etc.

Figure 7A:
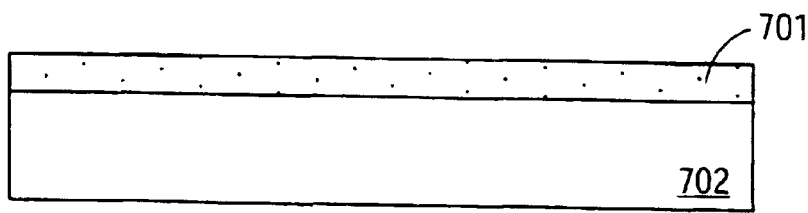
FIGS. 7A to 7F illustrate another exemplary semiconductor device (e.g., a transistor) that can be fabricated in a Ge substrate formed in accordance to some of the embodiments of the present invention.

FIGS. 7A to 7D illustrate another electronic device that can be fabricated using a bonded wafer pair formed in accordance to the methods previously described. The electronic device is an integrated detector comprising germanium that may provide electrical output driven by an optical input to integrated circuits in a substrate. In FIG. 7A, a Si wafer 702, which may be a monocrystalline silicon, is provides.

Figure 7B:
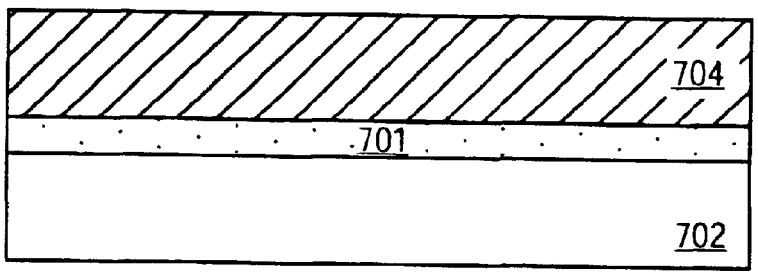
Figure 7C:
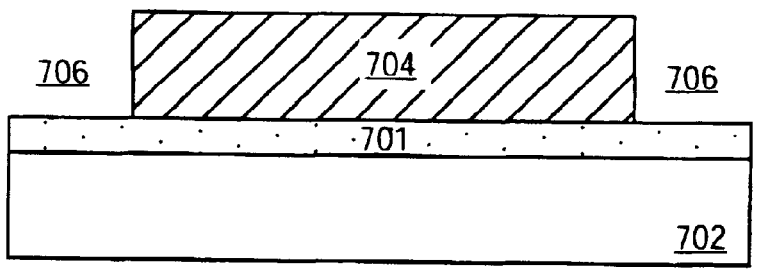
Figure 7D:
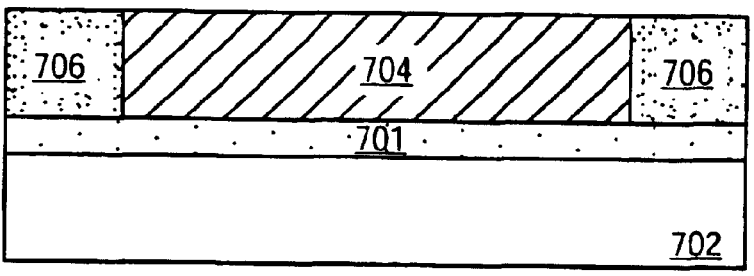

In FIG. 7B, a Ge wafer 704 is bonded to the silicon dioxide layer 701 according to the present invention. The Ge wafer 704 may be a monocrystalline Ge and may include another oxide layer (not shown). In one embodiment, Ge wafer 74 is not doped to ensure maximum performance for the detector. The Ge wafer 704 may also include shallow trench isolations 707 formed using conventional methods to insulate one device from another. The shallow trench isolations 706 can be formed by a conventional etching method to first etch the regions for the shallow trench isolation 706 and then fill the regions with an insulator, typically $SiO_2$. The etched region for the shallow trench isolation 706 can be of any suitable dept and as shown in FIG. 7C, sufficiently deep to remove most or all of the Ge from the shallow trench isolation 706. In one embodiment, a conventional chemical mechanical polishing method may be used to polish the $SiO_2$ to ensure sufficient planarity as shown in FIG. 7D.

Figure 7E:
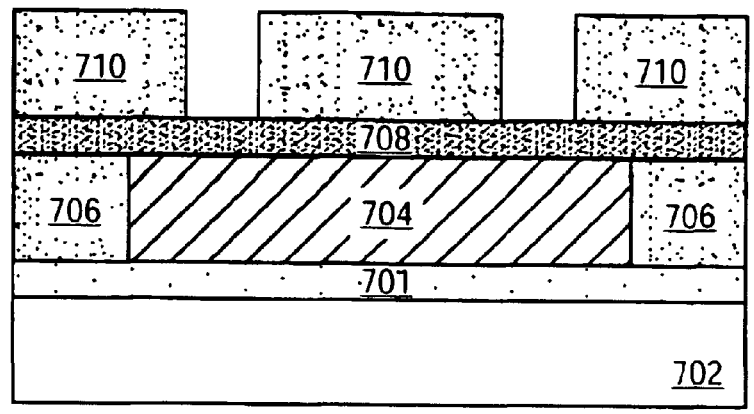

In FIG. 7E, a waveguide 708 is formed on the Ge wafer 704 using conventional methods. The waveguide 708 is further encapsulated by an oxide layer 710 which are dielectric layers. It is common for the integrated structure to have the waveguide 708 be made out of a relatively high-refractive index material (e.g., $Si_3N_4$ which has a refractive index n=2.05). The waveguide 708 is typically encapsulated in a material with lower refractive index (e.g., $SiO_2$ which has a refractive index n=1.46). When light is introduced in the waveguide 708 having the high refractive index material, the light will be confined there. The waveguide 708 then "guides" the light from the source (typically an external laser) to the detector (in this case the Ge wafer 704).

Figure 7F:
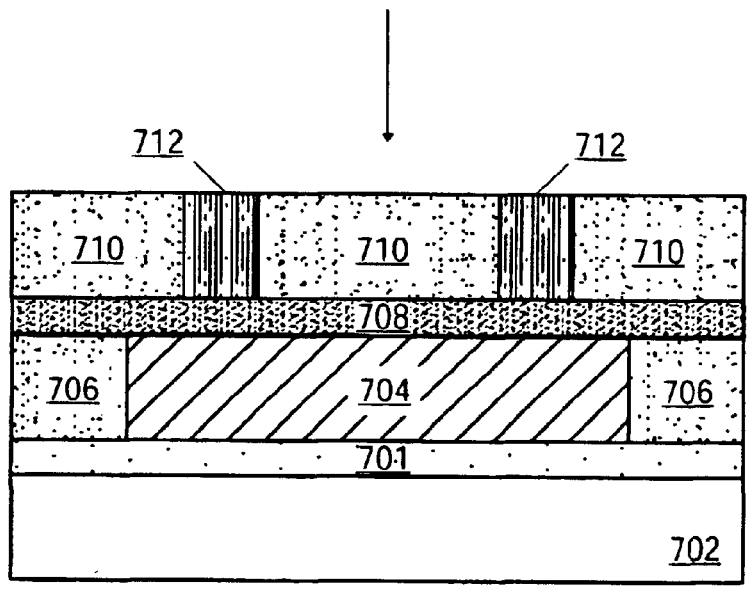

In FIG. 7F, detector electrodes 712 are formed in the top oxide layer 710. In order for the Ge wafer 704 to function as a detector, a bias must be applied across it. Any light shining on the detector then generates electron-hole pairs. These pairs are swept by the bias field, causing current to flow through the Ge wafer 704. There is an electrical response to a light impulse. The detector electrodes 712 are needed to provide the required bias. In one embodiment, a conductive material, such as metal, is deposited and then patterned using conventional methods. In this embodiment, the detector electrodes 712 are deposited by a damascene process, well practiced in the field. More specifically, a trench is defined with standard litho techniques in the top oxide layer 710 as shown in FIG. 7E; then, a metal is deposited everywhere (so that the trench is completely filled); then, the excess metal on the top surface of the top oxide layer 710 is polished off to give the detector shown in FIG. 7F.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A method of bonding germanium (Ge) onto a semiconductor wafer comprising:

providing a Ge wafer having a cleaving plane defined by ion implantation and causing a surface activation on at least one surface of the Ge wafer;

providing a semiconductor wafer and causing a surface activation on at least one surface of the semiconductor wafer;

bonding the Ge wafer to the semiconductor wafer to form a bonded wafer pair;

causing a first annealing to the bonded wafer pair, the first annealing occurring at a temperature approximately between 50–100° C.; and causing a second annealing to the bonded wafer pair, the second annealing occurring at a temperature approximately between 110–170° C., the second annealing cleaves the Ge wafer at the cleaving plane.

2. A method as in claim 1 wherein the cleaving plane defines a first portion and a second portion of the Ge wafer, the first portion being a predetermined portion of the Ge wafer to be transferred onto the semiconductor wafer and the second portion being a predetermined portion of the Ge wafer to be removed and wherein the second annealing cleaves away the first portion the surface of the second portion is polished after the first portion is removed.

3. A method as in claim 2 further comprising:

thinning the second portion a desired thickness.

4. A method as in claim 1 wherein the semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

5. A method as in claim 1 wherein the method forms a Ge—Si substrate or a Ge-on-insulator substrate.

6. A method as in claim 1 wherein the causing a surface activation on at least one surface of the Ge wafer includes causing an oxygen plasma surface activation on the at least one surface of the Ge wafer.

7. A method as in claim 1 wherein the causing a surface activation on at least one surface of the semiconductor wafer includes at least one of causing an oxygen plasma surface activation on the at least one surface of the semiconductor wafer and wet etching the at least one surface of the semiconductor wafer.

8. A method as in claim 1 wherein the first annealing includes ramping up the temperature to 50–100° C. at a rate of 1° C./minute and wherein the second annealing includes ramping up the temperature to 110–170° C. at a rate of 1° C./minute.

9. A method as in claim 1 wherein the first annealing occurs for a duration between 20–60 hours and wherein the second annealing occurs for a duration between 15–35 hours.

10. A method of fabricating a semiconductor device comprising:

providing a Ge wafer having a cleaving plane defined by ion implantation, the cleaving plane defines a first portion of the Ge wafer to be removed and a second portion of the Ge wafer to be transferred;

providing a semiconductor wafer;

bonding the Ge wafer to the semiconductor wafer to form a bonded wafer pair;

causing a first annealing to the bonded wafer pair, the first annealing occurring at a temperature approximately between 50–100° C.;

causing a second annealing to the bonded wafer pair, the second annealing occurring at a temperature approximately between 110–170° C., and the second annealing cleaves the Ge wafer at the cleaving plane to remove the first portion of the Ge wafer;

forming a gate dielectric, a gate electrode on the second portion of the Ge wafer;

forming a spacer on each side of the gate dielectric and the gate electrode; and forming source/drain regions in the second portion of the Ge wafer.

11. A method as in claim 10 further comprising:

polishing the surface of the second portion of the Ge wafer after the first portion is removed and before the forming of the gate dielectric and gate electrode.

12. A method as in claim 11 further comprising:

thinning second portion a desired thickness after the first portion is removed and before the forming of the gate dielectric and gate electrode.

13. A method as in claim 10 wherein the semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

14. A method as in claim 10 wherein the first annealing includes ramping up the temperature to 50–100° C. at a rate of 1° C./minute and wherein the second annealing includes ramping up the temperature to 110–170° C. at a rate of 1° C./minute.

15. A method as in claim 10 wherein the first annealing occurs for a duration between 20–60 hours and wherein the second annealing occurs for a duration between 15–35 hours.

16. A method of forming a germanium-on-insulator substrate comprising:

providing a Ge wafer having a cleaving plane defined by ion implantation and a first oxide film formed on a surface of the Ge wafer;

causing a surface activation on the first oxide film of the Ge wafer;

providing a semiconductor wafer having a second oxide film formed on a surface of the semiconductor wafer;

causing a surface activation on the second oxide film of the semiconductor wafer;

bonding the Ge wafer to the semiconductor wafer to form a bonded wafer pair by bonding the first oxide film to the second oxide film;

causing a first annealing to the bonded wafer pair, the first annealing occurring at a temperature approximately between 50–100° C.; and causing a second annealing to the bonded wafer pair, the second annealing occurring at a temperature approximately between 110–170° C., and the second annealing cleaves the Ge wafer at the cleaving plane.

17. A method as in claim 16 wherein the cleaving plane defines a first portion and a second portion of the Ge wafer, the first portion being a predetermined portion of the Ge wafer to be transferred onto the semiconductor wafer and the second portion being a predetermined portion of the Ge wafer to be removed and wherein the second annealing cleaves away the first portion the surface of the second portion is polished after the first portion is removed.

18. A method as in claim 17 further comprising:

thinning the second portion a desired thickness.

19. A method as in claim 16 wherein the semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

20. A method as in claim 16 wherein the causing a surface activation on at least one surface of the Ge wafer includes causing an oxygen plasma surface activation on the at least one surface of the Ge wafer.

21. A method as in claim 16 wherein the causing a surface activation on at least one surface of the semiconductor wafer includes at least one of causing an oxygen plasma surface activation on the at least one surface of the semiconductor wafer and wet etching the at least one surface of the semiconductor wafer.

22. A method as in claim 16 wherein the first annealing includes ramping up the temperature to 50–100° C. at a rate of 1° C./minute and wherein the second annealing includes ramping up the temperature to 110–170° C. at a rate of 1° C./minute.

23. A method as in claim 16 wherein the first annealing occurs for a duration between 20–60 hours and wherein the second annealing occurs for a duration between 15–35 hours.

24. A method of fabricating a semiconductor device comprising:

providing a Ge wafer having a cleaving plane defined by ion implantation and a first oxide film formed on a surface of the Ge wafer, the cleaving plane defines a first portion of the Ge wafer to be removed and a second portion of the Ge wafer to be transferred;

causing a surface activation on the first oxide film of the Ge wafer;

providing a semiconductor wafer having a second oxide film formed on a surface of the semiconductor wafer;

causing a surface activation on the second oxide film of the semiconductor wafer;

bonding the Ge wafer to the semiconductor wafer to form a bonded wafer pair by bonding the first oxide film to the second oxide film;

causing a first annealing to the bonded wafer pair, the first annealing occurring at a temperature approximately between 50–100° C.;

causing a second annealing to the bonded wafer pair, the second annealing occurring at a temperature approximately between 110–170° C., and the second annealing cleaves away the first portion of the Ge wafer leaving the second portion bonded to the semiconductor wafer;

forming a waveguide on the second portion of the Ge wafer;

encapsulating the waveguide with an oxide layer; and forming electrodes on the oxide layer, the electrodes function as a detector.

25. A method as in claim 24 wherein the first annealing includes ramping up the temperature to 50–100° C. at a rate of 1° C./minute and wherein the second annealing includes ramping up the temperature to 110–170° C. at a rate of 1° C./minute.

26. A method as in claim 16 wherein the first annealing occurs for a duration between 20–60 hours and wherein the second annealing occurs for a duration between 15–35 hours.

* * * * *